US005615321A

United States Patent [19]
Corn

[11] Patent Number: 5,615,321
[45] Date of Patent: Mar. 25, 1997

[54] AUTOMATIC IDENTIFICATION OF GEOMETRIC RELATIONSHIPS BETWEEN ELEMENTS OF A COMPUTER-GENERATED DRAWING

[75] Inventor: Edward T. Corn, Agua Dulce, Calif.

[73] Assignee: Dassault Systemes of America Corp., Burbank, Calif.

[21] Appl. No.: 289,604

[22] Filed: Aug. 12, 1994

[51] Int. Cl.$^6$ .................................................. G06T 17/00
[52] U.S. Cl. .......................................... 395/133; 395/326
[58] Field of Search ........................... 395/119–123, 127, 395/128, 129, 133, 141, 142, 143, 155, 161, 919; 364/474.22–474.27

[56] References Cited

U.S. PATENT DOCUMENTS

| | | | |
|---|---|---|---|
| 4,785,399 | 11/1988 | Evans et al. | 364/300 |
| 4,845,643 | 7/1989 | Clapp | 364/518 |
| 4,855,939 | 8/1989 | Fitzgerald, Jr., et al. | 364/522 |
| 5,010,502 | 8/1991 | Diebel et al. | 364/522 |
| 5,138,697 | 8/1992 | Yamamoto et al. | 395/120 |
| 5,198,990 | 3/1993 | Farzan et al. | 364/560 |
| 5,251,268 | 10/1993 | Colley et al. | 382/14 |
| 5,353,395 | 10/1994 | Tokumasu et al. | 395/141 |
| 5,371,845 | 12/1994 | Newell et al. | 395/155 |
| 5,377,313 | 12/1994 | Scheibl | 395/122 |
| 5,390,294 | 2/1995 | Tokeuchi | 395/155 |
| 5,396,565 | 3/1995 | Asogawa | 382/14 |
| 5,412,762 | 5/1995 | Kondo | 395/120 |
| 5,425,109 | 6/1995 | Saga et al. | 382/187 |
| 5,490,241 | 2/1996 | Mallgren et al. | 395/140 |

OTHER PUBLICATIONS

Declaration of Christopher C. Romes, executed Jul. 26, 1994
H. Samet; "The Design and Analysis of Spatial Data Structures" Addison–Wesley Publishing Company, Inc., pp. 1–151.
Declaration of Christopher C. Romes, executed Jul. 26, 1995.
Kanai, et al., "Generation of Free–From Surface Models by Understanding and Topological Constraints on Rough Sketches", Systems Engineering, 1992 International Conference, pp.
Clarke C., "Bravo New World–Schumberger AG's CAD–CAM System," CADCAM, vol. 11, pp. 17(3), Nov. 1992.
Schwartz D., "Modeling Made Easy: HP's ME30 Software Allows Leviton Manufacturing to get Over the Hump", HP Professional, vol. 8, pp. 24(2), Apr. 1994.
Luzadder W., "Fundamentals of Engineering Drawing", pp. 85/86, 1981.
Newton, "Tips & Technology, Apple Computer, Inc.," 1993.
Newton, "MessagePad 100 Setup and Handwriting Guide", Apple Computer, Inc., 1994.
Newton, "MessagePad Handbook", Apple Computer, Inc., 1993.

*Primary Examiner*—Almis R. Jankus
*Attorney, Agent, or Firm*—Blakely, Sokoloff, Taylor & Zafman

[57] ABSTRACT

The number and complexity of the individual computations required to automatically identify geometrical constraints in a two dimensional model are reduced by indexing line vectors associated with individual line segments and tangent vectors associated with individual circular arcs in a polar quadtree index separate and distinct from a Cartesian quadtree index used to index individual points and circles, as well as the end points of the individual line segments and arcs, and the centers of the individual arcs. The Cartesian quadtree is used to identify constraints between point elements, and the polar quadtree is used to identify constraints between line elements. In order to determine whether there is a point-on relationship between a point element and a line element, the line element (which may be a circle or an arc) is used to define one or more search paths through adjoining nodes of the Cartesian quadtree. For identifying lines tangent to a specified circle, a list of angles is used to generate test tangents which are in turn used to search for corresponding lines in the polar quadtree.

8 Claims, 3 Drawing Sheets

AUTOMATIC IDENTIFICATION OF GEOMETRIC RELATIONSHIPS BETWEEN ELEMENTS OF A COMPUTER-GENERATED DRAWING

TECHNICAL FIELD

The present invention relates generally to the generation and display of computerized drawings and more particularly to a computerized system for automatically identifying possible geometric relationships (such as "terminated by" or "parallel to") between individual points, lines, and other drawing elements.

BACKGROUND ART

In conventional computer assisting drafting, the individual elements (such as line segments, circles, and arcs) of a drawing are typically specified as vector-based data. For example, in Cartesian coordinates, a point is represented by (x,y), with x representing the horizontal distance from a vertical y-axis, and y representing the vertical distance from a horizontal x-axis. In a similar fashion, a circle can be represented as a center point $(X_c, Y_c)$ having an associated radius (r), and a line segment can be represented as two points $(X_a, Y_a)$, $(X_b, Y_b)$. In theory, if each of the relevant elements is accurately dimensioned and its position fixed with respect to the two coordinate axes, then any geometric relationship between elements will be inherent and need not be explicitly specified. However, because dimensional data is subject to round-off errors and/or measurement errors, and because geometric constraint information is not subject to such errors and is invariant during scaling and other manipulation of the image, manually generated geometrical constraints (such as coincident with, terminated by or parallel to) have been used to supplement absolute dimensional information (position, length, radius, etc.) to specify a vector-based image.

It is a relatively trivial matter to determine whether the Cartesian coordinates of corresponding points of two specified elements are identical (within a given tolerance) and thus whether the respective elements defined by those points are coincident. Determining whether two specified sets of non-coincident endpoints define respective lines which are perpendicular or parallel requires computing a trigonometric formula corresponding to the difference in slope of the two lines, but is also relatively simple. In a similar manner, a straightforward trigonometric formula will determine whether a specified point is on a specified line. Determining whether a specified point is on a specified circle or whether a specified line is tangent to a specified circle is only a slightly more complex trigonometric calculation, particularly if the Cartesian coordinates have been translated so that the center of the circle is at the origin. However, it is still a difficult and time consuming computation to find all possible geometric constraints between a large number of elements. Since each possible pair of elements must be reviewed for all possible constraints, the computation time using a simple search strategy will increase in proportion to the square of the number of elements. Moreover, computing the trigonometric formulas associated with angle and tangential relationships requires more computational resources than the simple comparison of numbers associated with coincident points. The problem of providing sufficient computational resources is exacerbated when the constraints are being generated and displayed in real time.

A quadtree index is a two-dimensional equivalent to a conventional binary index used to locate data within a linear array, and is typically used to locate points in a two-dimensional space. Such a quadtree index is based on the subdivision of a two-dimensional space into four not necessarily identical subspaces (quadrants) and on the recursive division of each of those quadrants into a hierarchial sequence of quadrants within quadrants until there is at most only one point (or several points that are coincident within a predetermined tolerance) in each. The final result is a not necessarily symmetric "tree" structure whose "root" is at the center of the original space, and whose "leaves" are at the end of the branches. If the tree containing a known set of points is optimized (i.e., does not contain any unnecessary nodes), then each node will either be a root node or a branch node that does not contain any points, or else will be one of a set of four related leaf nodes which collectively contain at least one point; if the points are not uniformly distributed, the size of many of the individual leaf nodes in the optimized quadtree will be significantly larger than dictated by the tolerance dimension, thereby significantly reducing the number of leaf nodes. Once such an optimized quadtree index has been constructed, locating any data associated with a particular point is accomplished by following the tree from the root node to the relevant leaf node, using the relative location of the point with respect to the center of the current node to determine whether to branch up or down and left or right.

The quadtree concept is extendible to more than two dimensions (for example, an "octree" for use with 3 dimensional data) and to non-Cartesian coordinate systems. A quadtree based on polar coordinates is called a "polar quadtree". A two dimensional binary tree ("bintree") is similar to a quadtree, but recursively decomposes the two-dimensional space into two subspaces along only one axis for the even-numbered divisions, and along the other axis for the odd-numbered divisions.

The use of an evenly divided Cartesian quadtree as a spatial index for two dimensional data (such as points and lines in a computer-aided design system) is a particular application of polygonal decomposition ("tiling") of a two dimensional space and is described at length in Hanan Samet: *The Design and Analysis of Spatial Data Structure*, copyrighted by Addison Wesley Publishing Company in 1990. That reference also discusses the decomposition of two-dimensional space based on non-polygonal tiles using a "sector" bintree to divided the polar plane into sectors of equal angular intervals Θ and a "polar" quadtree to partition the polar plane on the basis of both ρ and Θ. However, the author notes that "generally for a decomposition scheme to be useful in geometric applications, it must have pixel-sized squares (i.e., 1×1) as the primitive tiles" [§1.4.1, p 24], and that a space decomposition based on polygonal tiles is "the prevalent method in use today" [§1.4.2, p 26]. The author also notes that in the sector tree, rotation is "not simple" and that translation is "computationally expensive".

In order to perform a parametric transformation of the underlying computer model of an object depicted in a computerized drawing, it is necessary to specify not only dimensions of individual components (such as lines and circles) and identify which are subject to change during the parametric transformation, but also to specify geometric constraints between elements (including reflexive constraints such as relative orientation (e.g., "parallel") or touching end-to-end ("mutual relimitation"), and non-reflexive constraints such as "point-on" a line or a T-shaped intersection ("non-reflexive relimitation") which are to remain invariant during the transformation process. Software is commercially available to process a constrained model to provide exact dimensional and position data for each element of each component, before and after any indicated transformation has taken place, while keeping the various elements connected in accordance with the specified constraints. Geometrical and/or dimensional constraints are also useful for eliminating the requirement to provide accurate dimensional data for all components. Thus if four line segments are constrained geometrically as being connected end-to-end at right angles and two adjacent sides are constrained dimensionally to be the same length, the resultant model is already constrained to be a square and it should only be necessary to specify the initial orientation of one of the lines and the length of one side in order to define the entire object.

Since computerized drawing systems typically operate in real time in response to data input by a human operator, it is desirable that the operator be able to input the data in as intuitive a manner as possible, that the operator not be required to input redundant data, and that the system assemble the data into a geometric model having a predetermined data structure (such as PCADAM supported by Dassault Systemes of America) and display the resulting model in the form of one or more computer generated drawings for correction or validation by the operator, and that the processing of the data into the displayed drawing or drawings be performed efficiently and without perceptible delay.

Accordingly there is a need for method and apparatus for automatically processing data representing the size and location of points, lines, circles and other geometric components into a constrained model by identifying apparent geometric relationships between the elements of different components, to thereby facilitate further revision and possible parametric variation of the model.

DISCLOSURE OF INVENTION

It is an overall object of the present invention to provide an efficient computerized method and associated apparatus for identifying possible geometrical constraints between the elements in a computerized model, particularly when the elements in the model may deviate within a predetermined tolerance from the corresponding theoretical values of a properly constrained model.

It is an object of a more specific aspect of the invention to organize and index the data in a manner that reduces the number of computations to identify such constraints.

It is an object of another more specific aspect of the invention to organize and index the data in a manner that reduces the complexity of the individual computations.

In accordance with the present invention, the foregoing and other related objects are accomplished by a novel computerized drafting system which automatically identifies certain geometric constraints between points and lines defined in an underlying model.

More specifically, the invention simplifies the identification process and reduces the number of elements that must be processed by indexing the underlying data with a multidimensional indexing scheme such as a quadtree, to thereby facilitate the identification of any elements located at a particular location in a multi-dimensional space.

In accordance with an even more specific aspect, two n-tree indices are used, including a Cartesian n-tree associated with points (including centers of circles and endpoints of line segments and circular arcs) represented in Cartesian coordinates, and a polar n-tree associated with lines (including tangents at the endpoints of circular arcs) represented in polar coordinates. The Cartesian n-tree is used to find points in the vicinity of a specified location (e.g., a concentricity relationship between two circles or a relimiting relationship between the end of a line and the center of a circle) or within a predetermined tolerance of a specified path (e.g., a relimiting relationship between an endpoint of one line that is on an intersecting second line); the polar n-tree is used to find lines collinear with other lines (e.g., a tangent relationship with one end of a specified circular arc), lines having a predetermined slope (e.g., lines parallel to or perpendicular to a specified line), and lines (including tangent vectors at the ends of other circular arcs) tangent to an arbitrary point on a specified circle (e.g., a tangency relationship).

For certain operations, such as identifying all lines tangent to an arbitrary point on a specified circle, computation time may be significantly reduced by appending to the polar tree a list of the different values of the $\Theta$ present in the tree. The angle list may be a simple ordered list of the value of each "distinct" angle $\Theta$ in the polar quadtree, from which similar angles that differ within a predetermined tolerance have been eliminated.

In accordance with another specific aspect of the invention, since points may be within a given tolerance of a test point but in a node adjacent to the particular node corresponding to that test point, provision is also made for identifying certain elements in adjacent nodes.

In accordance with yet another specific aspect of the invention, since the test point and the identified point will not necessarily be indexed in the same node and thus known a priori to be coincident within the tolerance used to construct the tree, provision is also made for testing the identified elements to verify whether they do in fact salify a particular constraint within a particular tolerance.

BEST MODE FOR CARRYING OUT THE INVENTION

Figure 1:
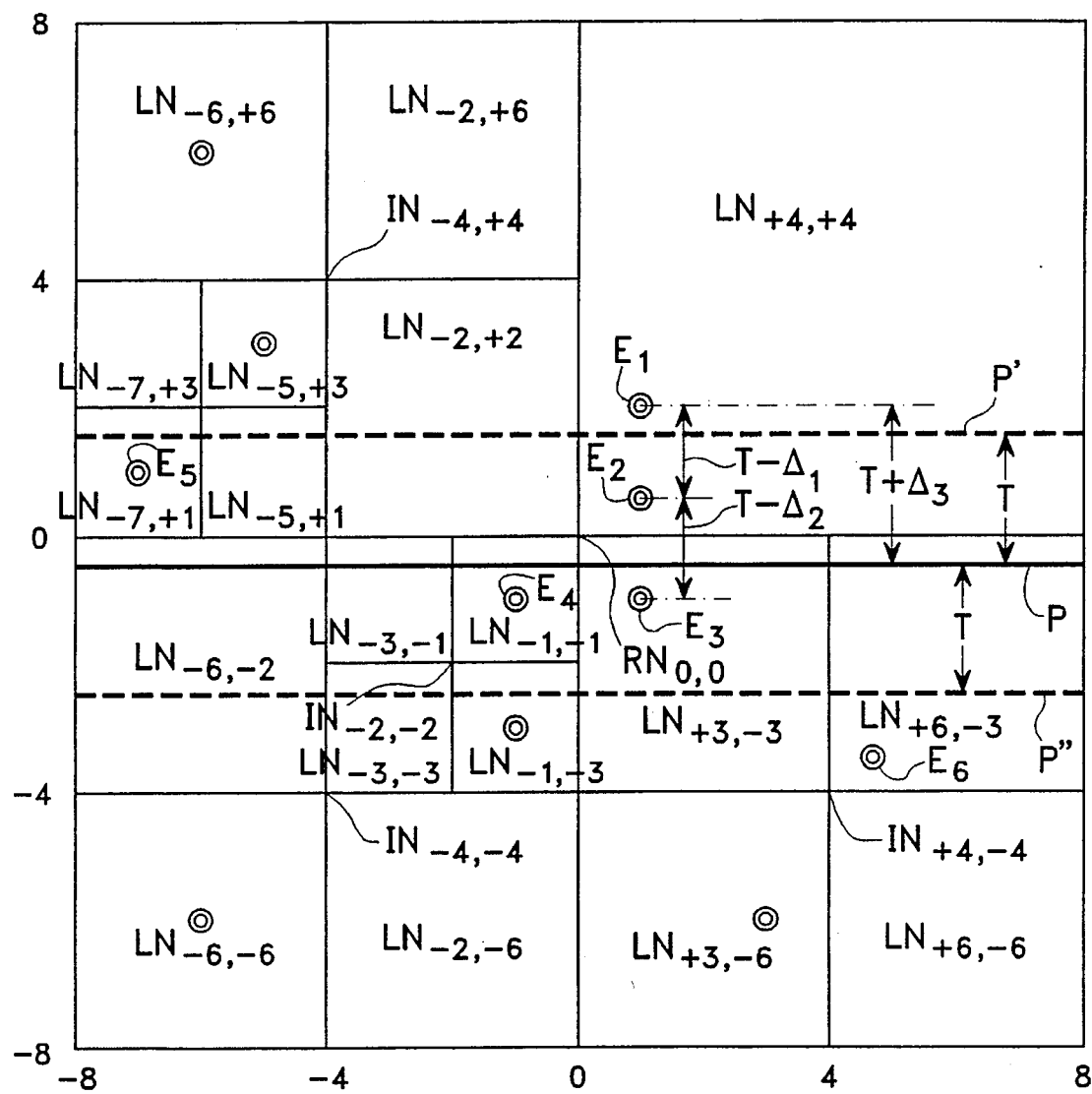
FIG. 1 is a diagram of a Cartesian quadtree containing a number of data points, as well as a test point, a linear test path, and a circular test path.

A conventional Cartesian quadtree is represented diagrammatically in FIG. 1 and may be implemented as a linked hierarchy of data structure representing a tree T, nodes N within the tree, and elements E within the nodes. The tree contains a pointer to the root node $RN_{0,0}$. Each node contains the node's location (for example its center) and size (for example, the length of one of its sides) and pointers to a list of any associated elements (if a leaf node LN) or to its four quadrant nodes (if an internal node IN). For example, the upper right quadrant of root node RN is a leaf node $LN_{+4,+4}$ having a length 8 and containing two points $E_1$, $E_2$ separated by a vertical distance $T-\Delta_1$ less than the tolerance $T=2$ used to build the Cartesian quadtree $T_R$. The lower right quadrant of root node RN is an internal node $IN_{-4,-4}$ which is divided into four quadrants each having a length 4, with the upper right quadrant containing a lower level internal node $IN_{-2,-2}$ which in turn contains 4 leaf node each of length 2, and the upper left quadrant being a leaf node $LN_{+3,-3}$ having a point $E_3$ separated by a vertical distance $T-\Delta_2$ from point $E_2$.

Note that some leaf nodes (search as LN+4,+4) will contain more than one element, while other leaf nodes (such as LN+6,−6) will not contain any elements (in which case the node pointers in the parent internal node will be set to NULL to save space). Also note that two points (such as elements $E_2$ and $E_3$) can be separated horizontally and vertically by less than the tolerance T=2 used to build the quadtree, and yet will not both be in the same leaf node. Moreover, as shown by elements $E_1$ and $E_2$, the distance between an element and the center of its leaf node can be significantly greater than the tolerance T=2 used to build the quadtree. Accordingly, to find all the points in the tree located within a predetermined tolerance to a particular point (sometimes referred to as the test point), once the leaf node (e.g. node $LN_{+4,+4}$ of FIG. 1) has been found that should have contained the test point (e.g, element $E_2$), the point search routine should not only test all data points (e.g., element $E_1$) in that node to determine if they are in fact located within that predetermined tolerance of the test point, but also determine if the test point is within a horizontal or vertical tolerance of ±T from any adjacent nodes, in which case the points in those adjacent nodes (e.g., nodes $LN_{+3,-1}$ and $LN_{-2,+2}$) should be examined. Equivalently, all searches could be performed using not only the original test point, but also eight supplemental test points vertically and/or horizontally displaced from the original test point by ±T.

The element list preferably includes the location of the element (its x and y coordinates, if the element is a point and the tree is a Cartesian quadtree), a pointer to the corresponding element in a separate data structure such as the underlying "model" defining a geometric image in a computer assisted drawing program, and a pointer to the next associated element (if any).

The quadtree may be maintained using straightforward housekeeping routines for creating, deleting, and maintaining the tree and its associated data structures. Such housekeeping routines will be well within the skill of the average artisan. Conventional trace and display routines may also be useful will be for debugging purposes.

Figure 2:
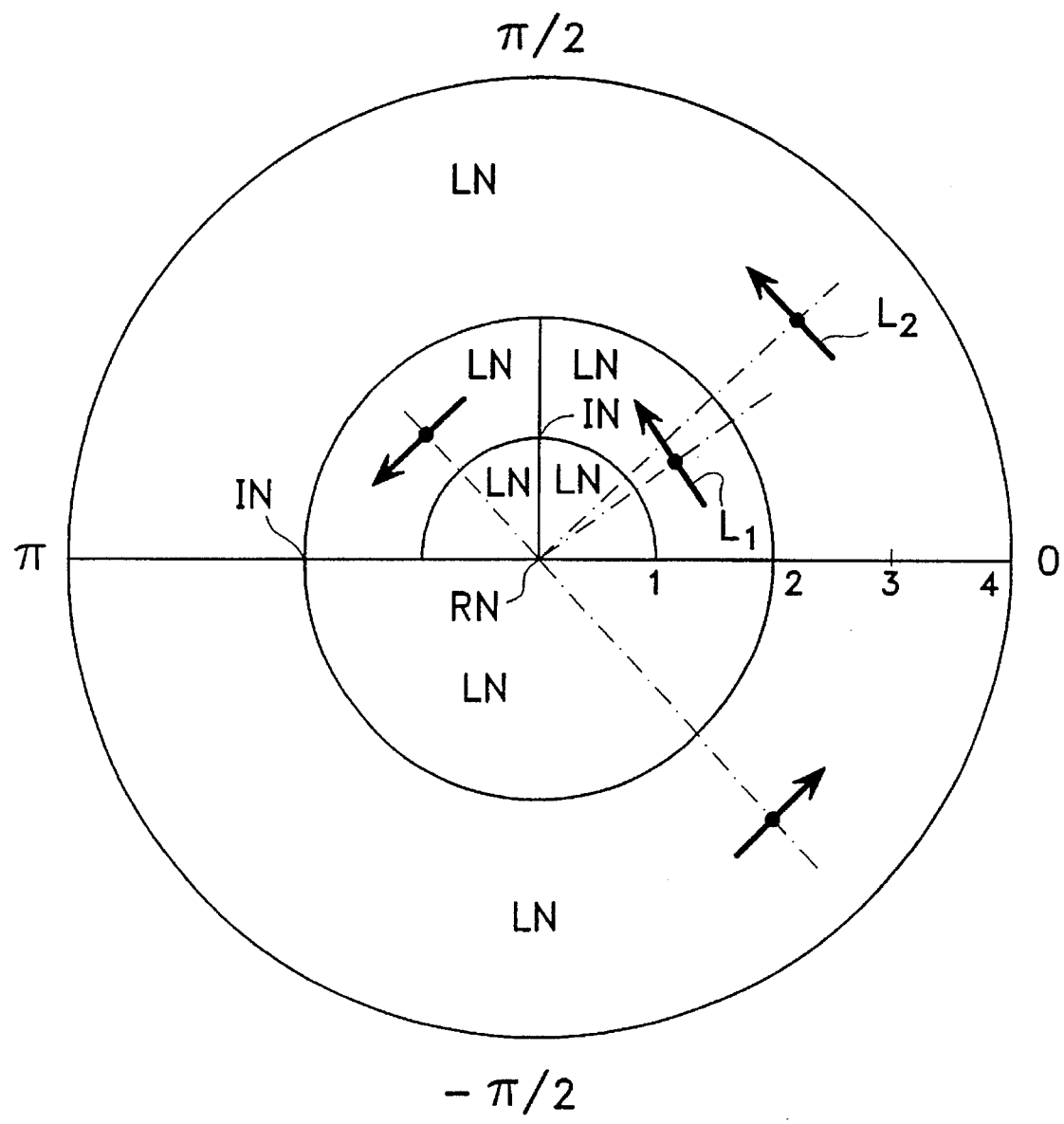
FIG. 2 is a diagram of a polar quadtree containing a number of lines, as well as a linear test path corresponding to lines having a predetermined slope.

Computationally, except for the cyclic properties of Θ (Θ=2) and the fact a reversed sign of ρ corresponds to addition of π to ρ, the polar quadtree $T_p$ shown in FIG. 2 is analogous to the Cartesian quadtree $T_R$ and can utilize the same data structure and housekeeping routines. In particular the "point" (ρ,Θ) represents a line of infinite length having an angular orientation Θ and located at a perpendicular distance ρ from the origin. However, for certain operations, computation time may be significantly reduced by appending a list of the different values of the angle Θ present in the tree. The angle list may be a simple ordered list of the value of each "distinct" angle Θ in the polar quadtree, from which similar angles that differ within a predetermined tolerance have been eliminated. Note that in FIG. 2, lines $L_1$ and $L_3$ have similar slopes and are therefore "parallel" within the predetermined tolerance used to construct the tree, but because they have significantly different perpendicular distances ρ to the origin, they are not "collinear" and are in fact in different leaf nodes.

The following search routines are provided:

QTFPNT The previously described point search routine. Since a point in Cartesian coordinates corresponds to a line in polar coordinates, this routine may also be used to search the polar quadtree to find lines having (within a predetermined tolerance for ρ and Θ) a specified values of ρ and Θ.

QTFPLN Finds the points in a Cartesian quadtree on (within a given tolerance) a line (for example, line P of FIG. 1) having specified intersections with (or parallel to) the x and y axes. As noted previously, two points (or a point and a line) can be separated by less than the tolerance used to construct the quadtree, and yet may be indexed in adjacent nodes. Accordingly, two additional test lines are formed, one (P' in FIG. 1) displaced T above and T to left of the specified line and the other (P" in FIG. 1) displaced T below and T to right of the specified line. Each of the three lines is used to trace a respective test path through adjoining leaf nodes of the quadtree (e.g, line P' and leaf nodes $LN_{+4,+4}$, $LN_{-2,+2}$, $LN_{-5,+1}$ and $LN_{-7,+1}$ of FIG. 1) and the elements indexed in each of those adjoining leaf nodes (e.g., points $E_1$, $E_2$ and $E_5$) are inspected for possible constraint relationships (e.g, do they lie on line P). Since a point in Cartesian coordinates corresponds to a line in polar coordinates, the "points" defined by all the lines having the same slope Θ will be on a "line" parallel to the ρ axis, this routine may also be used in the polar tree to find lines having a specified slope.

QTFPCR Finds the points in a Cartesian quadtree on (within a given tolerance) a circle having a specified center and a specified radius. This routine is similar to QTFPLN, except that the test paths are concentric circles.

QTFCTN Finds the lines in a polar quadtree tangent to a circle having a specified center and a specified radius. Each angle Θ in the angle list is used to generate two test lines $(\rho_1,\Theta)$ $(\rho_2,\Theta)$ tangent to the specified circle. Each of the test tangent lines is then used by QTFPNT to search the polar quadtree for lines having the same values (±T) for ρ and Θ.

In order to find the geometric relationships of interest, the elements in the underlying model are first indexed in a manner which gives a significant performance advantage by avoiding the need to check every point for coincidence with every other point in the model, and likewise for parallel lines, etc. In particular, use of a quadtree index limits the element search to just those elements that are in the immediate vicinity (as established by the predetermined tolerance used to construct the index) of the element being tested. The resultant performance in time to find all geometric relationships in a model is on the order of $N.Log_4(N)$, compared to $(N^2+N)/2$ for a simple search.

In accordance with the invention, two different quadtrees are utilized: one in rectangular ("Cartesian") coordinates for finding coincident and collinear points, and one in polar coordinates for finding parallel, collinear, and perpendicular lines and for finding circle tangents.

In a presently preferred embodiment, the following geometric elements are of interest:

| Element | Index | Description |
| --- | --- | --- |
| Point.Point | Rect. | Point. |
| Line.Line | Polar | Line of infinite length. |
| Line.End | Rect. | Point at one of two ends of a line segment. |
| Circle.Circle | N/A | Full circle (only its center point is indexed). |

-continued

| Element | Index | Description |
| --- | --- | --- |
| Circle.Center | Rect. | Center point of a circle. |
| Circle.End | Rect. | Point at one of two ends of a segment of a circle. |
| Circle.Vec | Polar | Line tangent to a circular segment at one of its two end points. |

The following relations are of interest:

| Relation | Description | Relevant to |
| --- | --- | --- |
| STCOIN | Coincidence | Point.Point-Point.Point<br>Circle.Center-Circle.Center |
| STCLIN | Collinear | Line.Line-Line.Line |
| STCCEN | Concentric | Point.Point-Circle.Center<br>Circle.Center-Circle.Center |
| STPARA | Parallel | Line.Line-Line.Line |
| STPERP | Perpendicular | Line.Line-Line.Line |
| STRELM | Relimitation | Line.Line-Line.End<br>Line.Line-Circle.End<br>Circle.Circle-Line.End<br>Circle.Circle-Circle.End |
| STTANG | Tangent | Line.Line-Circle.Vec<br>Line.Line-Circle.Circle<br>Circle.Vec-Circle.Vec<br>Circle.Circle-Circle.Vec |
| STRLCN | Relimit to center | Line.End-Circle.Center<br>Circle.End-Circle.Center |
| STPTON | Point on | Point.Point-Line.Line<br>Circle.Center-Line.End<br>Circle.Center-Line.Line<br>Point.Point-Circle.Circle |
| STENDP | End point | Line.End-Point.Point<br>Circle.End-Point.Point |
| STMRLM | Mutual relimit | Line.End-Line.End<br>Line.End-Circle.End<br>Circle.End-Circle.End |

All are reflexive except STPTON, STRELM, and STRLCN.

Figure 3:
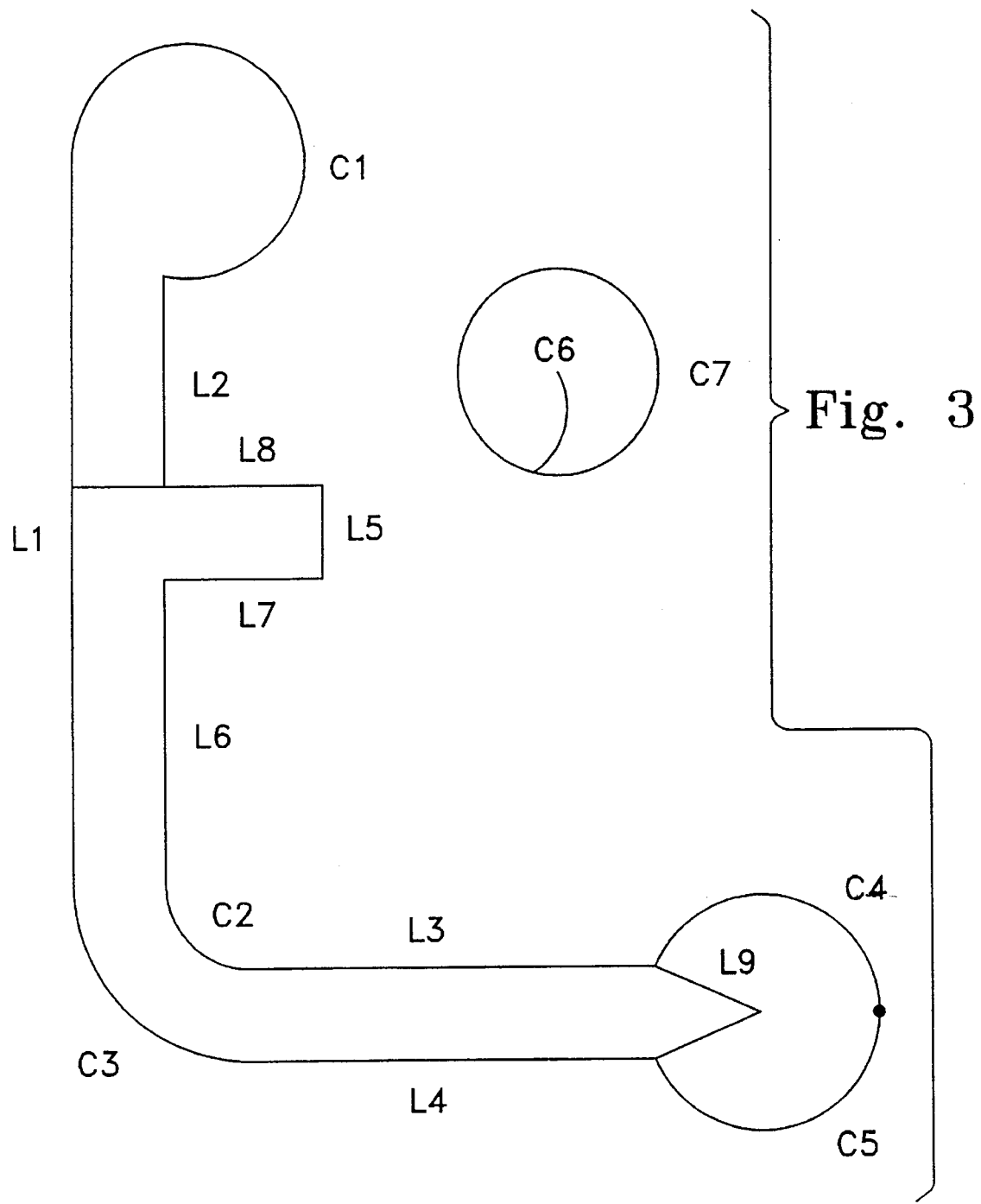
FIG. 3 is a two dimensional drawing depicting an underlying model having elements related by various geometrical constraints.

All point-oriented data (Point. Point, Line.End, Circle.End, Circle.Center) in the model is used as an input to routine QTFPNT to search the rectangular coordinate tree and any resultant output is then tested for examples of the following (the referenced elements appear in FIG. 3):

Coincidence (STCOIN, Point.Point, Point.Point) between points.

An endpoint relationship (STENDP, Point.Point, Line.End) between a point and an end of a line.

An endpoint relationship (STENDP, Point.Point, Circle.End) between a point and an end of a circular arc.

A mutual relimit relationship (STMRLM, Line.End, Line.End) between adjacent ends of two lines. See Line L7 and Line L5.

A mutual relimit relationship (STMRLM, Line.End, Circle.End) between adjacent ends of a line and a circular arc. Note that a line may be relimited to circle more than once or vice versa, as in the case of a line across a chord of a circle. See Line L2 and Circle C1.

A mutual relimit relationship (STMRLM Circle.End, Circle.End) between adjacent endpoints of two arcs. See Circle C4 and Circle C5.

A relimit to center relationship (STRLCN, Line.End, Circle.Center) between the end of a line and the center of a circle. See Line L9 and Circle C4.

Concentricity (STCCEN, Point.Point, Circle.Center) between points and circles.

Concentricity (STCCEN, Circle.Center, Circle.Center) between the circle and another circle.

Coincidence (STCOIN, Circle.Center, Circle.Center) between the circle and another circle, if they have equal radii. (See Circle C5 and Circle C4).

A relimit to center relationship (STRLCN, Circle.End, Circle.Center) between the endpoint and a circle center See Circle C6 and Circle C7.

A point-on relationship (STPTON, Circle.Center, Circle.End) between a circle center and the circle containing the endpoint. See Circle C6 and Circle C7.

A point-on relationship (STPTON, Circle.Center, Line.End) between the center of a circle and a line. See Line L9 and Circle C4.

Note that, depending on the distribution of the various types of elements and the time required to search the tree versus the time required to test the found elements for a particular relationship, it may be more efficient to use the second element in the relationship to find the first element.

Each line in the model is used as an input to routine QTFPNT to search the polar coordinate tree and the output is then tested for examples of the following:

A collinear relationship (STCLIN, Line. Line, Line.Line) between the line and another line.

Each line (Line.Line) in the model is used as an input to routine QTFPLN to search the rectangular coordinate tree and the output is then tested for examples of the following:

A point-on relationship (STPTON, Point.Point, Line.Line) between a point and a line.

A point-on relationship (STPTON, Line.Line, Circle.Center) between a circle center and the line. See Line L9 and Circle C4.

A relimiting relationship (STRELM, Line.End, Line.Line) between the line and an endpoint of another line. See Line L8 and Line L1.

A relimiting relationship (STRELM, Circle.End, Line.Line) between the line and an endpoint of a circular arc. Note that a circular arc may be relimited to the same line more than once, as in the case of a chord of a circle. See Line L3 and Circle C4.

Note that rather than try to find points on a line by checking each point in the model, the line is used to limit the search to points likely to be on the line.

A "line" corresponding to the slope of each line in the model is used as an input to routine QTFPLN to search the polar coordinate tree and the output is then tested for examples of the following:

A parallel relationship (STPARA, Line.Line, Line.Line) between the line and another line, if (not STCLIN) or (off STCLIN). See Line L6 and Line L2.

A "line" corresponding to the slope of each line in the model plus $\pi/2$ is used as an input to routine QTFPLN to search the polar coordinate tree and the output is then tested for examples of the following:

A perpendicular relationship (STPERP, Line.Line, Line.Line) between the line and another line. See Line L3 and Line L1.

Each tangent vector at each end of a circular arc in the model is used as an input to routine QTFPNT to search the polar coordinate tree and the output is then tested for examples of the following:

Tangency (STTANG, Line.Line, Circle.Vec) between the end of the arc and a line. See Line L1 and Circle C1.

Tangency (STTANG, Circle.Vec, Circle.Vec) between the end of the arc and an end of another arc, if the two ends are the same in rectangular coordinates. See Circle C5 and Circle C4.

Each circle in the model is used as an input to routine QTFPCR to search the rectangular coordinate tree and the output is then tested for examples of the following:

A point-on relationship (STPTON, Point.Point, Circle.Circle) between a point and the circle.

A point-on relationship (STPTON, Circle.Center, Circle.Circle) between a center of another circle and the circle.

A relimiting relationship (STRELM, Line.End, Circle.Circle) between an end of a line and the circle. Note that a line may be relimited to a circle more than once, as in the case of a chord. See Line L2 and Circle C1.

A relimiting relationship (STRELM, Circle.End, Circle.Circle) between an end of an arc and the circle. See Circle C6 and Circle C7.

Each circle in the model is used as an input to routine to QTFCTN to search the polar coordinate tree and the output is then tested for examples of the following:

Tangency (STTANG, Line.Line, Circle.Circle) between a line and the circle. See Line L8 and Circle C7.

Tangency (STTANG, Circle.Vec, Circle.Circle) between an end of a segment of another circle and the circle, but only if the end in question is on the circle. See Circle C5 and Circle C4.

In order to avoid building an over-constrained model and to reduce the number of constraints and thus the computational complexity required to make any changes to the model, the following guidelines should be applied before a found constraint is added to the model:

1. If there is already a relationship between the elements of the type currently being built, then do not build another.

2. If the constraint type is disabled, then do not build the constraint.

3. Do not build the relationship if the two elements are the same.

4. In any case where an end of an element is involved in the relationship, that end number will be stored in an extended data area of the constraint.

5. Identify a lead element for each set of related elements of the same type, in order to eliminate redundant constraints.

6. Particularly where large tolerances are involved, check for conflicting constraints and select the most accurate.

The following specific rules have been implemented in a preferred embodiment:

1. Check the ends where the relationship may have end condition dependencies.

2. Avoid redundant relimit constraints of different classes (mutual and normal relimit).

3. Only allow relimit (mutual relimit) on collinear lines if the end points are coincident.

4. If a mutual relimit constraint already exists between two elements, build only one constraint per end.

5. Only build a point-on constraint between a circle center and a line if the circle is the lead element of a concentric or coincident set, or if it is not member of either kind of set.

6. Do not build a parallel constraint when a collinear constraint exists and is not disabled.

7. Do not build a tangent constraint when a coincident constraint exists and is not disabled.

8. Add a same size circle constraint only if the circles are not coincident.

9. Add a perpendicular constraint only if each of the lines is the lead element of a respective parallel set or is not in any parallel set.

10. If there are possible inconsistent mutual relimit constraints with either end of the same line, build only the constraint with the closer end.

11. If there are possible inconsistent point-on and tangent constraints between a line and the center and the outside of a circle, build only the constraint with the closer element.

12. Only build one perpendicular relationship for a given line.

13. Only build one parallel relationship for a given line that is not the lead element in the parallel set.

The above list should not be considered exhaustive, and other similar specific rules to eliminate redundant, competing and/or conflicting constraints will doubtless be apparent to those skilled in the art.

Two or more elements in the same node will be co-located within the tolerance used to construct the quadtree, and as a general rule may be considered to be "coincident". However, in particular applications, it may be advantageous to use a coarser tolerance to build the quadtree (thus reducing the number of nodes and the search time) and a finer tolerance to determine whether a found element is coincident with, or is otherwise constrained by, the search element. For example, a polar quadtree will consider two lines having similar slopes and perpendicular distance from the origin as coincident, even though the actual distance between adjacent points on those two lines will be magnified by the distance of those points from the perpendicular vectors. Similarly, any space between a tangent line and a circle will be magnified by the distance between the circle and the line's perpendicular vector. Moreover, especially because tolerances are additive, constraints are not necessarily transitive and it may be desirable to organize more than two mutually constrained elements (for example a grating formed from a large number of parallel lines) as a list of elements linked by a common constraint to a common "lead" element.

In some applications, it may also be useful to identify dimensional constraints such as lines having the same length or circles having the same radius. Since dimension is a single-valued variable, such dimensional constraints may be readily identified by means of a conventional linear index.

In a presently preferred embodiment suitable for processing one or more freehand linear images into a two dimensional mechanical drawing depicting an object having more or less regular geometry, relatively large tolerances are used for angle-oriented constraints and the search for possible constraints is limited to elements appearing in the currently displayed image. Each newly input linear image is compared and indexed in real time, with the elements of each basic stroke forming each linear image being used to access and update the previously processed index of elements in the window for possible constraints relating to that stroke. After all the basic strokes have been processed, the model is rebuilt using the newly found constraints and the freehand image is replaced by a computerized drawing depicting the revised model with the newly found constraints.

What is claimed is:

1. In a computer aided system for using a model constructed from a plurality of components (points, line segments, circles, arcs, etc.) to depict a two dimensional image of the model, each of said components including one or more associated point elements (isolated points, endpoints, centers, etc.) and/or linear elements (lines, tangents, etc.)

each defined by n≧2 variables, a computerized method for automatically identifying geometrical constraints (coincident, collinear, parallel, perpendicular, relimited, point-on, concentric, tangent, etc.) between two or more of said elements, said method comprising the steps:

using n variables (x, y) associated with each of the point elements in the model to index the point elements in a first n-ary tree (TR);

using a first sequence of said elements in the model to search the first tree for nodes possibly containing point elements satisfying a predetermined geometric constraint with a predetermined tolerance with a respective element of said first sequence;

using n variables associated with respective one of a sequence of linear elements in the model to index the linear elements in a second n-ary tree;

using a second sequence of elements in the model to search the second tree for nodes possibly containing linear elements satisfying a second predetermined geometric constraint within a second predetermined tolerance; and testing any thus-found other elements to determine whether they do in fact satisfy a respective said predetermined geometric constraint within a respective said predetermined tolerance.

2. The method of claim 1, wherein said model is a two dimension model, n=2, said first tree is a Cartesian quadtree, and said first sequence of elements includes points to be tested for possible coincidence with points in the first tree and lines to be tested for possible point-on relationships with points in the first tree.

3. The method of claim 2, wherein said second tree is a polar quadtree, and said second sequence includes lines to be tested for possible coincidence with other lines in the polar quadtree, and circles to be tested for possible tangency with lines in the polar quadtree.

4. The method of claim 3, wherein said second tree includes a simple ordered list of the value of each "distinct" angle $\Theta$ in the polar quadtree.

5. The method of claim 3, wherein similar angles that differ within a predetermined tolerance have been eliminated from said list.

6. The method of claim 1, wherein said predetermined tolerance is greater than zero, and each point oriented search of each of said trees is capable of locating candidate points separated from a test point by said predetermined tolerance, even if the candidate points are in a node adjacent to the node associated with a particular test point.

7. The method of claim 6, wherein each line oriented search of said first tree includes at least two search paths, separated by a predetermined tolerance.

8. The method of claim 7, further comprising the step:

testing any elements during any line oriented search of said first tree to determine whether they do in fact satisfy a respective said predetermined geometric constraint within a respective said predetermined tolerance.

* * * * *